(12) United States Patent
Chien et al.

(10) Patent No.: US 7,268,055 B2
(45) Date of Patent: Sep. 11, 2007

(54) METHOD OF FABRICATING SEMICONDUCTOR DEVICE

(75) Inventors: Tsai-Yuan Chien, Hsinchu (TW); Liang-Chuan Lai, Hsinchu County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 38 days.

(21) Appl. No.: 11/163,980

(22) Filed: Nov. 7, 2005

(65) Prior Publication Data
US 2006/0252203 A1 Nov. 9, 2006

(30) Foreign Application Priority Data
May 5, 2005 (TW) ............... 94114492 A (51) Int. Cl.
*H01L 21/76* (2006.01)
(52) U.S. Cl. .............. 438/424; 438/257; 257/316
(58) Field of Classification Search ........... 438/257, 438/424, 689; 257/316, 330, 332
See application file for complete search history.

(56) References Cited

U.S. PATENT DOCUMENTS

| | | | | |
|---|---|---|---|---|
| 5,998,263 | A | * 12/1999 | Sekariapuram et al. | ..... 438/259 |
| 2004/0106256 | A1* | 6/2004 | Dong et al. | ............... 438/257 |
| 2005/0142765 | A1* | 6/2005 | Joo | ........................... 438/264 |
| 2005/0287810 | A1* | 12/2005 | Li et al. | ..................... 438/695 |

* cited by examiner

*Primary Examiner*—Phuc T. Dang
(74) *Attorney, Agent, or Firm*—Jiang Chyun IP Office (57) ABSTRACT

A method of fabricating a semiconductor device is provided. Before covering the isolation structures with a conductive layer, a material layer is formed on the isolation structures. The fluid-like material layer allows the material layer formed between the isolation structures to be thicker than that formed on the top of the isolation structures. The isolation structures are then effectively etched back. The material layer at the top of the isolation structures is removed and a portion of isolation structures is also removed to lower the height of the isolation structures.

19 Claims, 8 Drawing Sheets

METHOD OF FABRICATING SEMICONDUCTOR DEVICE

CROSS-REFERENCE TO RELATED APPLICATION

This application claims the priority benefit of Taiwan application serial no. 94114492, filed on May 5, 2005. All disclosure of the Taiwan application is incorporated herein by reference.

BACKGROUND OF THE INVENTION

1. Field of the Invention

The present invention relates to a semiconductor process. More particularly, the present invention relates to a method for preventing damages to the isolation structure and methods of fabricating semiconductor devices and memory devices.

2. Description of Related Art

As the device dimension gradually reduces and the level of integration steadily increases, the size of the isolation structure between devices also reduces. Accordingly, the level of difficulties in the device isolation technology magnifies. In the current device isolation technology, the shallow trench isolation (STI) structure can be formed in various sizes. Further, the deficiency of a bird's beak formation as in the conventional local oxidation isolation technology can be avoided. Therefore, the STI technology is preferred for the sub 0.5 micron metal oxide semiconductor process.

Figure 1A:
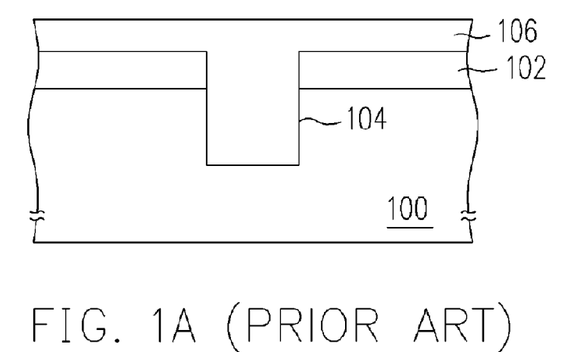
FIGS. 1A to 1B are schematic, cross-sectional view diagrams showing the steps for fabricating a shallow trench isolation structure according to the prior art.
Figure 1B:
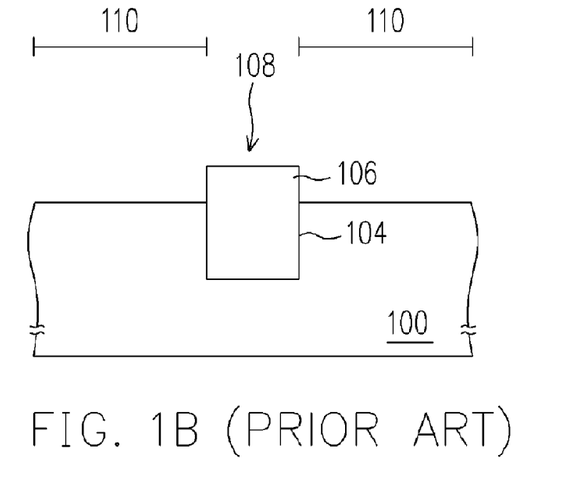

FIGS. 1A to 1B are schematic cross-sectional views showing the steps for fabricating a shallow trench isolation structure according to the prior art. Referring to FIG. 1A, a patterned mask layer 102 is formed on the substrate 100. With the patterned mask layer 102 serving as an etching mask, the substrate 100 is etched to form a trench 104 therein. An insulation layer 106 then fills the trench 104. Referring to FIG. 1B, a chemical mechanical polishing process is performed to remove the insulation layer 106 outside the trench 104. Thereafter, the patterned mask layer 102 is removed, and a shallow trench isolation structure 108 is resulted.

Figure 2:
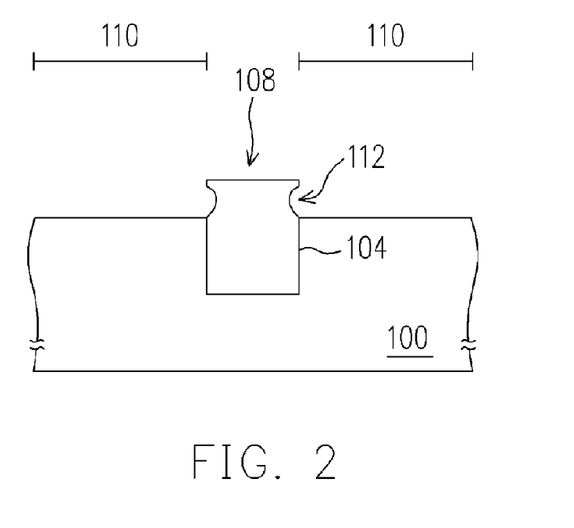
FIG. 2 is a schematic diagram illustrating the damage on a shallow trench isolation structure.
Figure 3:
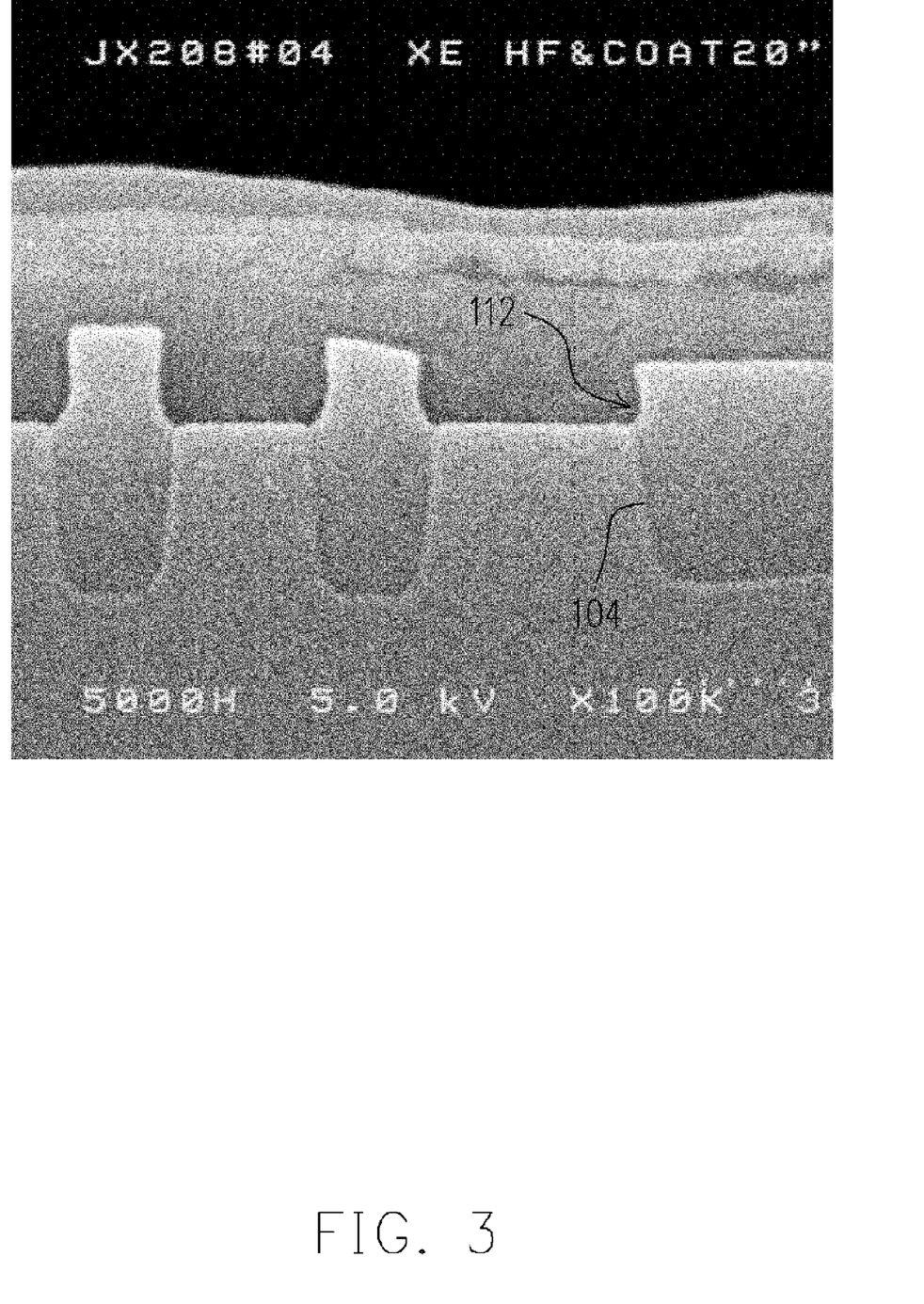
FIG. 3 is a picture showing the damage on a shallow trench isolation structure.

In general, the fabrication of the shallow trench isolation structure is completed before a related device manufacturing process is being performed. The formation of the shallow trench isolation structure 108 defines the active region 110 on the substrate 100. Thereafter, the fabrication of the semiconductor device or the memory device can be conducted. It is worthy to note that a cleaning process is an essential process in the subsequent fabrication process of a semiconductor device or a memory device. However, each cleaning may incur damages to a part of the shallow trench isolation structure 108. More particularly, re-entrant (as shown in FIGS. 2 and 3) is formed near the top corner of the trench 104. The damages incurred, besides potentially affecting the isolation effect of the shallow trench isolation structure 108, residues from the materials of the semiconductor device or the memory device may fill the re-entrant 112. When the residues filling the re-entrant 112 are conductive, the neighboring semiconductor devices or memory devices are bridged, short circuiting the semiconductor devices or the memory devices.

SUMMARY OF THE INVENTION

Accordingly, the present invention provides a fabrication method for a semiconductor device, wherein any damages that may inflict upon the isolation structure can be prevented to obviate a connection between two neighboring semiconductor devices.

The present invention provides a fabrication method for a semiconductor device. The method includes forming a plurality of isolation structures on the substrate to define the active region, wherein the top part of the isolation structures is higher than the surface of the substrate. A plurality of device structures is formed in the active region of the substrate, wherein the height of the device structures is defined by the isolation structures. A material layer is further formed on the substrate covering at least the isolation structures. Thereafter, the material layer at the top part of these isolation structures is removed. A portion of the isolation structures is also removed to lower the height of the isolation structures. A conductive layer is subsequently formed on the device structures.

The present invention provides a fabrication method for a semiconductor device. The method includes forming a plurality of isolation structures to define an active region, wherein the top part of the isolation structures is higher than the surface of the substrate. A plurality of trench type device structures is formed in the active region of the substrate, and the top part of these trench type device structures is higher than the substrate surface. A material layer is thereafter formed over the substrate covering the isolation structures, the trench type device structures and the exposed substrate. The material layer, for example, a fluid-like material, wherein the material layer disposed between the isolation structures is thicker than the material layer disposed at the top of the isolation structures and at the top of the trench type device structures. Thereafter, the material layer at the top of the isolation structures and at the top of the trench type device structures is removed. Moreover, a portion of the isolation structure is also removed to lower the height of the isolation structures. The remaining material layer is then removed, followed by forming an insulation layer on the surface of the trench type device structures. Thereafter, a pair of conductive spacers is formed on the insulation layer disposed on the sidewall of the trench type device structures.

According to the fabrication method of a semiconductor device of one embodiment of the present invention, the material layer is a fluid-like material, for example, a photoresist material or an organic anti-reflection coating material.

According to the fabrication method of a semiconductor device of one embodiment of the present invention, wherein the height of the isolation structures is lower to about 600 angstroms, for example.

According to the fabrication method of a semiconductor device of one embodiment of the present invention, the removal of the portion of the material layer and the portion of the trench isolation structures includes performing an etching back process. Further, the thickness of the material layer that is being removed is controlled by the duration of the etching back process.

According to the fabrication method of a semiconductor device of one embodiment of the present invention, a plurality of isolation structures is formed on the substrate to define the active region. A patterned mask layer is then formed on the active region of the substrate. Further using the patterned mask as an etching mask, a plurality of trenches is formed in the mask layer and the substrate. A tunneling layer is formed on the substrate surface in each trench. Thereafter, a conductive material fills the trenches. An etching back process is performed for the top part of the conductive material to be higher than the substrate surface and lower than the surface of the mask layer. A pair of spacers is formed on the exposed sidewall of the trench to cover a portion of the conductive layer. Using the pair of spacers as an etching mask, a first conductive material is removed to form a first floating gate and a second floating gate on the sidewall of each trench. A source region is then formed in the substrate at the bottom of each trench. Thereafter, a first gate dielectric layer is formed on the surface of each trench. Portions of the first gate dielectric layer and the tunneling layer are removed to expose the substrate surface at the bottom of each trench. Each trench is filled with a second conductive material to serve as a source line, wherein the top part of the source line is higher than the top of the first floating gate and the top of the second floating gate. The patterned mask is subsequently removed. A material layer, for example, a fluid-like material, is then formed over the substrate, covering the isolation structures, the source line and the exposed substrate. Further, the material layer disposed between the isolation structures is thicker than the material layer disposed at the top of the isolation structures and at the top of the source line. The material layer at the top of the isolation structures and at the top of the source line is removed. Moreover, a portion of the isolation structures is also removed to lower the height of the isolation structures. The remaining material layer is further removed. Thereafter, a second gate dielectric layer is formed over the substrate covering the source line, and a pair of conductive spacers is formed on the two sides of the source line.

In accordance to the present invention, after the formation of the material layer and the removal of the material layer and a portion of the isolation structures, the height of the isolation structures is lower. As a result, damages that may inflict upon the isolation structures in a subsequent process, for example, in a wafer cleaning process, can be mitigated. Therefore, the method of the present invention can reduce the formation of re-entrant on an isolation structure and prevent an undesirable connection between two neighboring semiconductor devices. The problem of a short circuit between devices can be effectively prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The present invention now will be described more fully hereinafter with reference to a semiconductor device in a trench-type memory device This invention, however, should not be construed as limited to the embodiments set forth herein.

Figure 4:
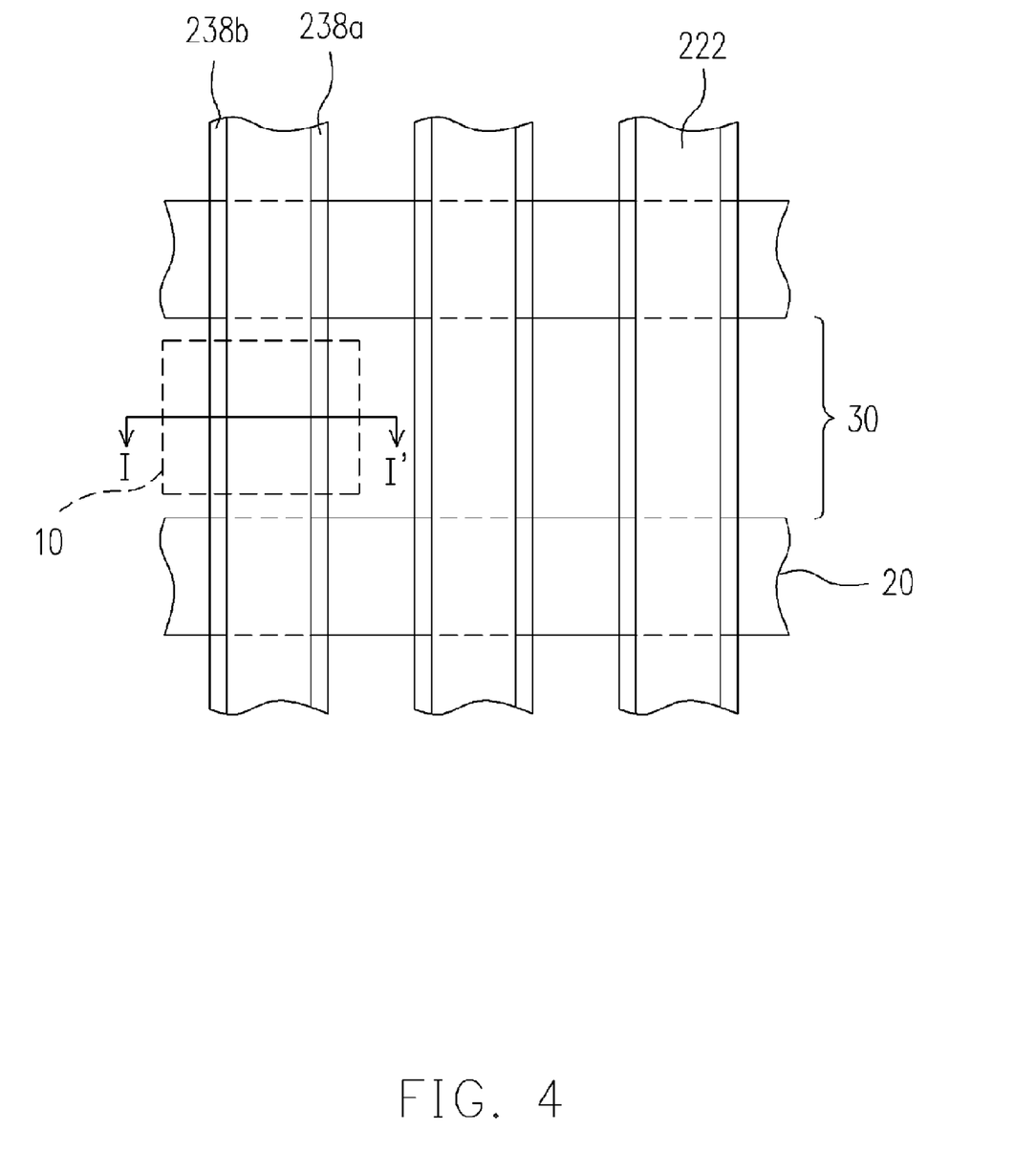
FIG. 4 is a schematic, top view diagram of a trench type memory device.

FIG. 4 is a schematic, top view diagram of a trench type memory device according to one embodiment of the present invention. FIGS. 5A to 5J are schematic cross-sectional views of one memory unit 10 in FIG. 4 along the cutting line I-I' showing the fabrication steps according to one embodiment of the present invention.

Figure 5A:
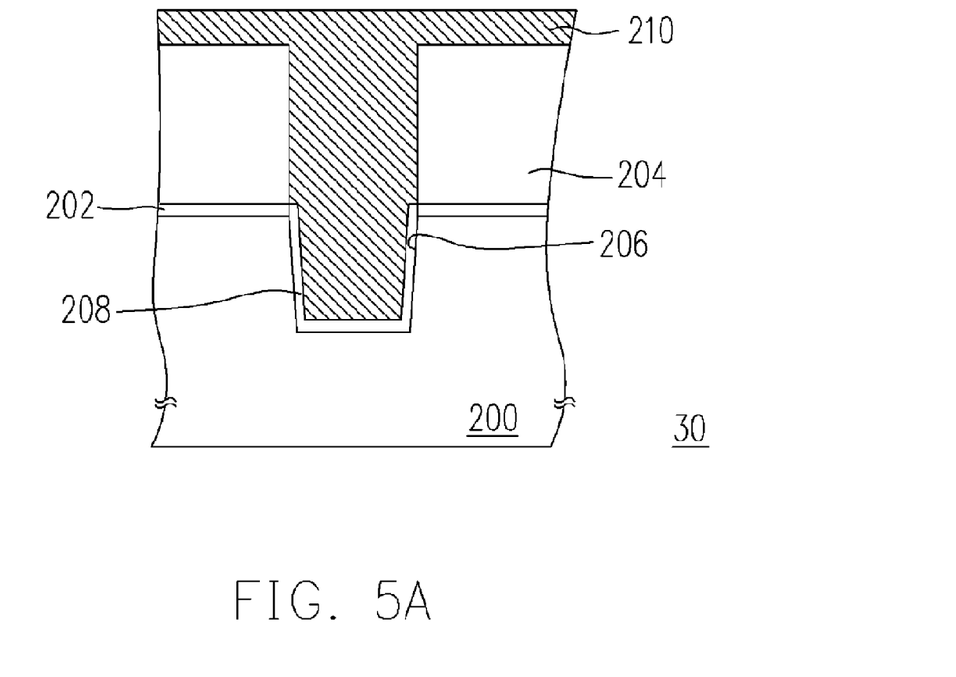
FIGS. 5A to 5J are schematic cross-sectional views of one memory unit 10 in FIG. 4 along the cutting line I-I' showing the fabrication steps according to one embodiment of the present invention.

Referring to both FIG. 4 and FIG. 5A, a substrate 200 having at least one isolation structure 20 formed therein is provided. The isolation structure 20, for example, configured in a stripe shape, defines the active region 30. Further, the height of the isolation structure 20 is higher than the surface of the substrate 200. The isolation structure 20 is formed by, for instant, local oxidation or shallow trench isolation.

Thereafter, a liner layer 202 is formed on the surface of the substrate 200 in the active region 30. The liner layer 202 is formed with, for instance, silicon oxide, by thermal oxidation, for example. In another embodiment, a dielectric layer (not shown) with a greater thickness is formed on the surface of the substrate. 200, wherein the dielectric layer is formed by chemical vapor deposition, for example. Thereafter, a mask layer 204 is formed over the liner layer 202. The material constituting the mask layer 204 includes silicon nitride, for example. The mask layer 204 is formed by chemical vapor deposition. The mask layer 204, the liner layer 202 and the substrate 200 are further patterned to form a trench 206 in the mask layer 204, the liner layer 202 and the substrate 200.

A tunneling layer 208 is then formed on the surface of the substrate 200 in the trench 206. A material constituting the tunneling layer 208 includes but not limited to silicon oxide. The tunneling layer 208 is formed by thermal oxidation, for example. Thereafter, a conductive layer 210 fills the trench 206. The conductive layer 210 includes, for example, doped silicon, which is formed by, for instance, forming an undoped polysilicon layer using chemical vapor deposition, followed by an ion implantation process.

Figure 5B:
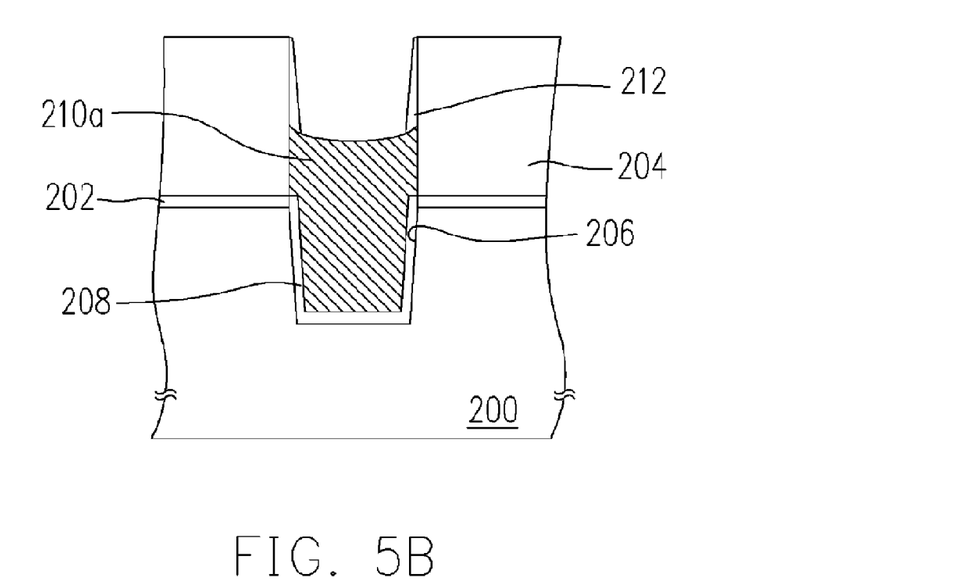

Referring to FIG. 5B, an etching back process is conducted to remove a portion of the conductive layer 210, leaving the conductive layer 210a inside the trench 206. The top part of the conductive layer 210a is higher than the surface of the substrate 200 but is lower than the surface of the mask layer 204. It is worthy to note that the height of the conductive layer 210a is defined by the height of the isolation structure 20. In this embodiment, the height of the conductive layer 210a is the same as that of the top surface of the isolation structure 20. A spacer 212 is formed on the sidewall of the exposed trench 206, covering a part of the top surface of the conductive layer 210a. The material of the spacer 212 has an etching selectivity different from that of the conductive layer 210a. The spacer 212 is formed by forming a layer of spacer material (not shown), followed by using anisotropic etching to remove a portion of the spacer material.

Figure 5C:
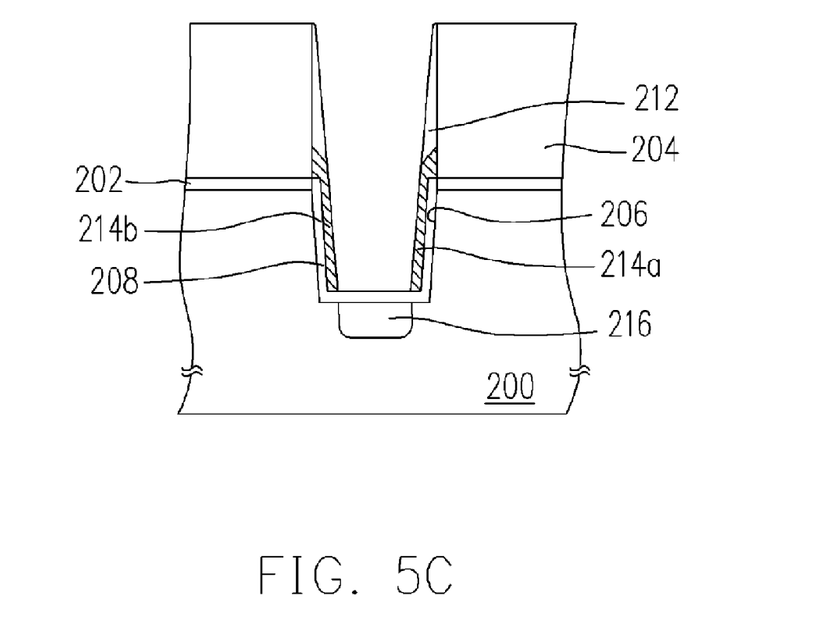

Continuing with FIG. 5C, using the spacer 212 as a mask, a portion of the conductive layer 210a is further removed to form a floating gate 214a and a floating gate 214b on the sidewall of the trench 206.

Still referring to FIG. 5C, a source region 216 is formed in the substrate 200 at the bottom of the trench 206. The source region 216 is formed by ion implantation, for example.

Figure 5D:
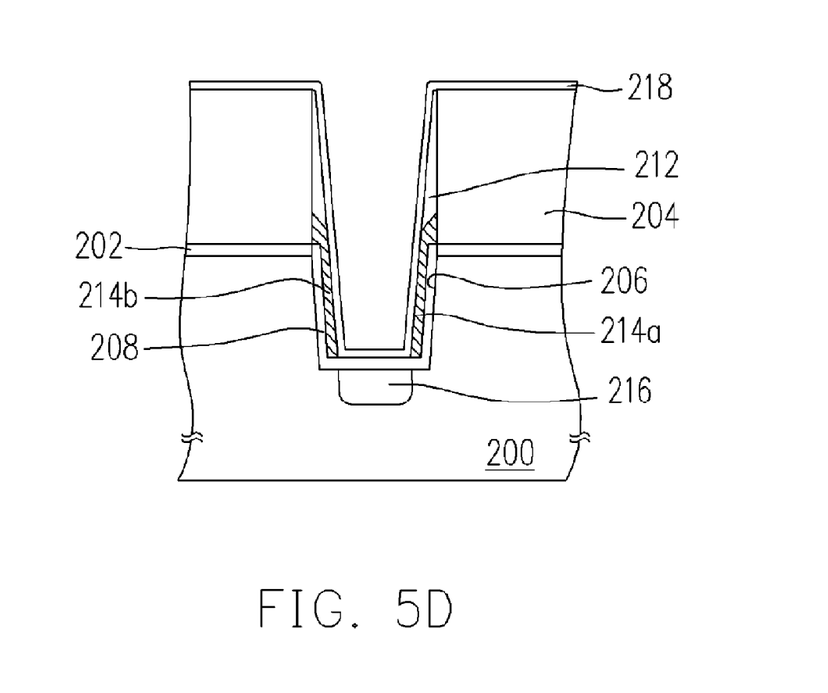

Referring to FIG. 5D, a gate dielectric layer 218 is formed on the surfaces of the substrate 200 and the trench 206. The gate dielectric layer 218 is formed with silicon oxide/silicon nitride/silicon oxide or silicon oxide, for instance.

Figure 5E:
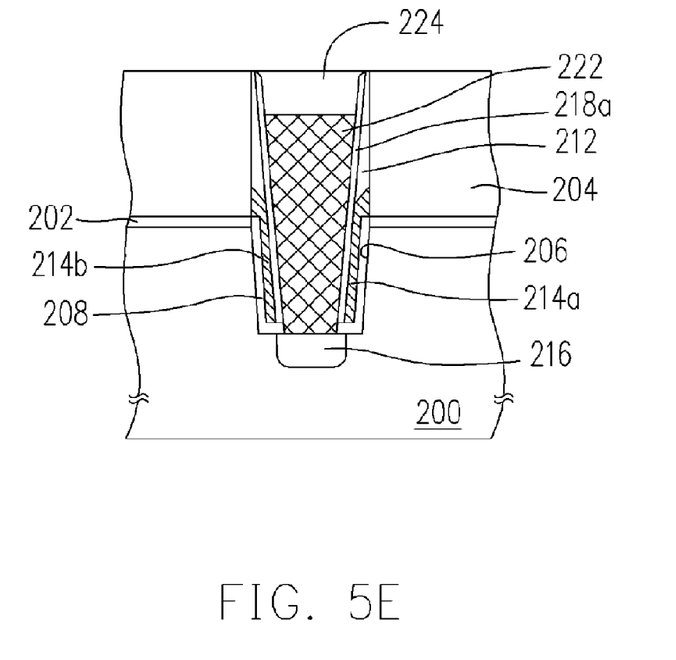

Referring to FIG. 5E, portions of the gate dielectric layer 218 and the tunneling layer 208 are removed to expose the substrate 200 surface at the bottom of the trench 206 to form the gate dielectric layer 218a. The portions of the gate dielectric layer 218 and the tunneling layer 208 are removed by a dry etching process, for example.

A conductive material then fills the trench 206 to serve as a source line 222. The top part of the source line 222 is higher than the floating gates 214a and 214b. The relative positions of the source line 222 and the isolation structure 20 are shown in FIG. 4. In other words, the source line 222 crosses over the isolation structure 20. The material of the source line 222 includes doped polysilicon. Thereafter, the cap layer 224 is formed to fill the trench, covering the source line 222.

Figure 5F:
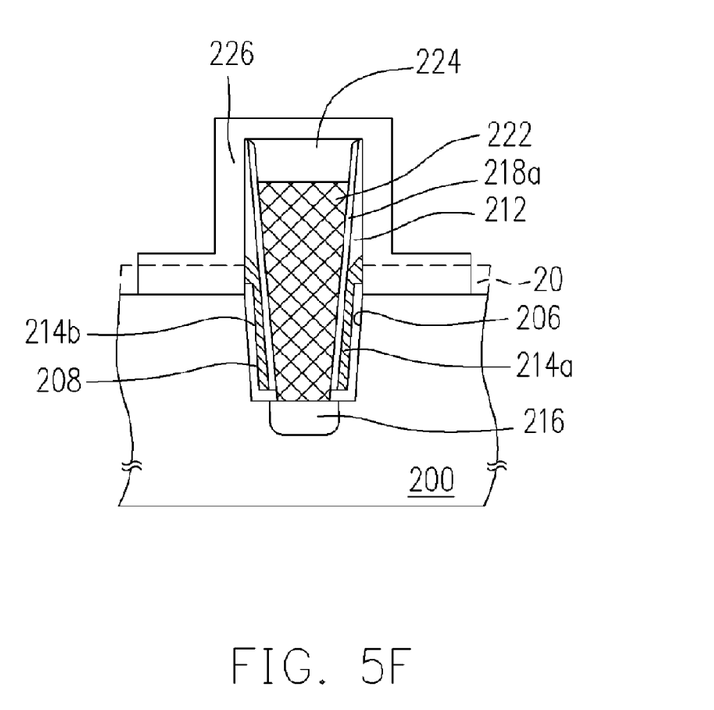

Continuing to FIG. 5F, the liner layer 202 and the mask layer 204 are removed. A material layer 226 is then formed over the substrate 200, covering the isolation structure 20, the source line 222 and the exposed substrate 200. The material layer 226 disposed between the isolation structure 20 is thicker than the material layer 226 disposed at the top parts of isolation structure 20 and the source line 222, respectively. In one embodiment, the material layer 226 includes a fluid-like material to allow the region between the isolation structures 20 be thoroughly filled in order to form a non-conformal film layer. Accordingly, the subsequent planarization can be achieved. In other words, the material layer 226 between the isolation structures is thicker, while the material layer 226 at the top part of the isolation structure 20 and the top part of the source line 222 is thinner. In yet another embodiment, the material of the material layer 226 is, for instance, a photoresist material or an organic anti-reflection coating material. The material layer 226 is formed by spin-coating, for example. The material layer 226 is not limited to a particular thickness as long as the thickness of the material layer 226 will not incur damages to the substrate 200 during the removal of the material layer 226.

Figure 5G:
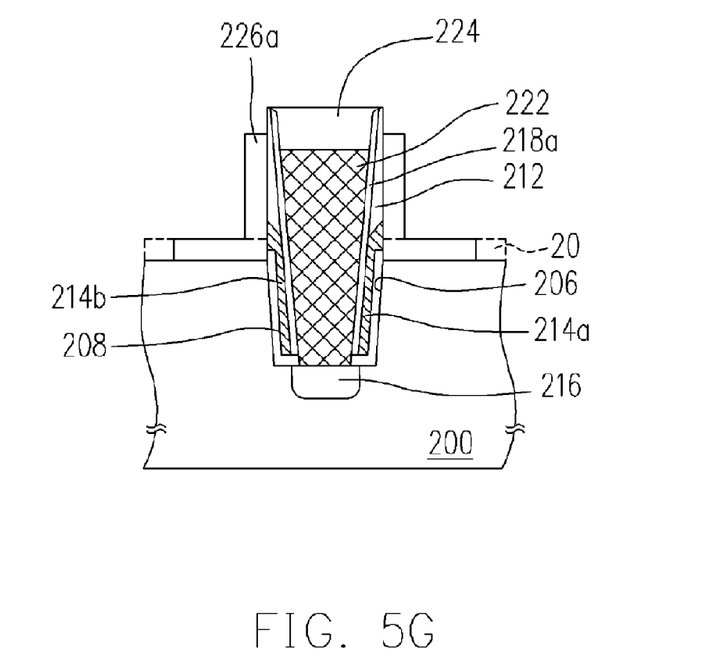
Figure 5H:
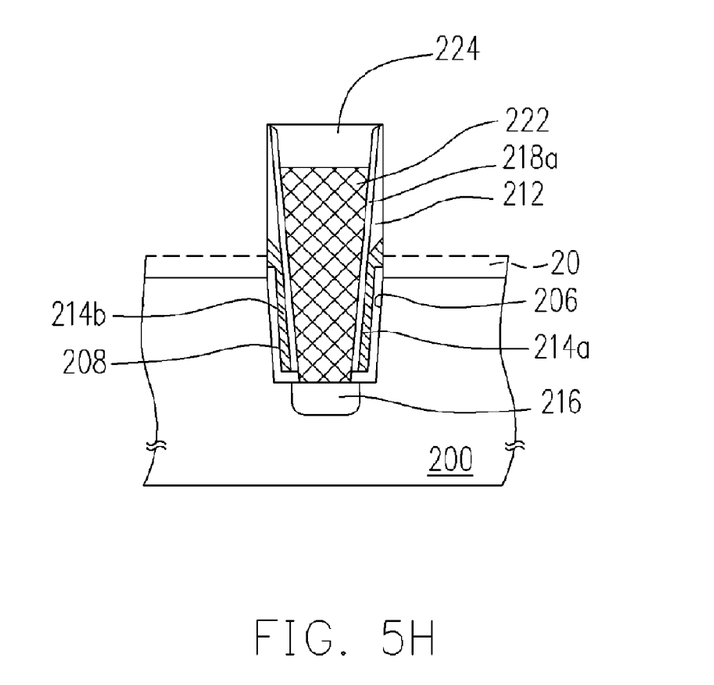

Continuing to FIG. 5G, the material layer 226 at the top parts of the isolation structure 20 and the source line 222 are removed to form the material layer 226a. Further, a portion of the isolation structure 20 is removed to lower the height of the isolation structure 20 to achieve planarization. Removing portions of the material layer and the isolation structure 20 include performing an etching back process, for example, a dry etching back process. In one embodiment, the etching back process can lower the height of the isolation structure 20 to about 600 angstroms, for example. Moreover, the thickness of the film layer that is being removed can be controlled by the duration of the etching back process. As shown in FIG. 5H, the remaining material layer 226a is removed.

Figure 5I:
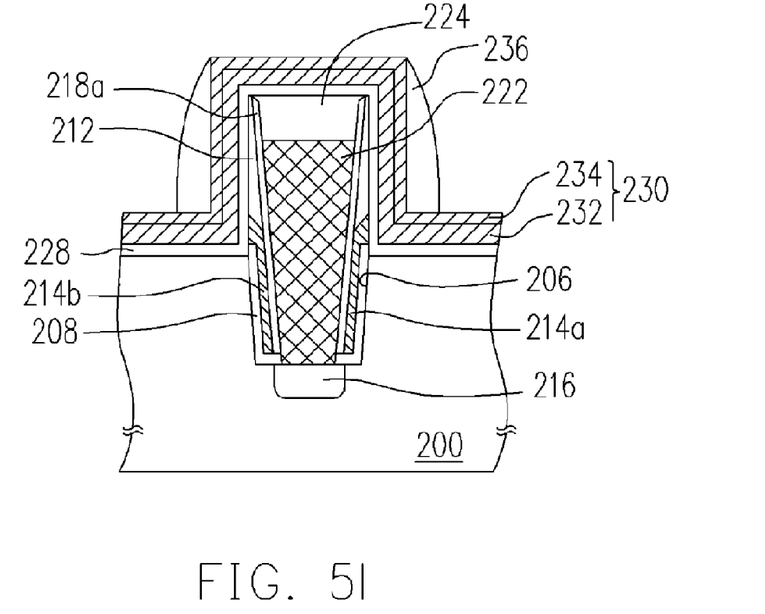

As shown in FIG. 5I, a gate dielectric layer 228 is formed over the substrate 200 covering the substrate 200 and the structures on the surface of the substrate 200. The material of the gate dielectric layer 228 includes but not limited to silicon oxide or silicon oxide/silicon nitride/silicon oxide.

A conductive layer 230 is then formed over the gate dielectric layer 228. In one embodiment, the conductive layer 230 is formed with a doped polysilicon layer 232 or a doped polysilicon layer 232 and a silicide layer 234. Spacers 236 are further formed on the sidewalls of the spacer 212 and floating gates 214a and 214b.

Figure 5J:
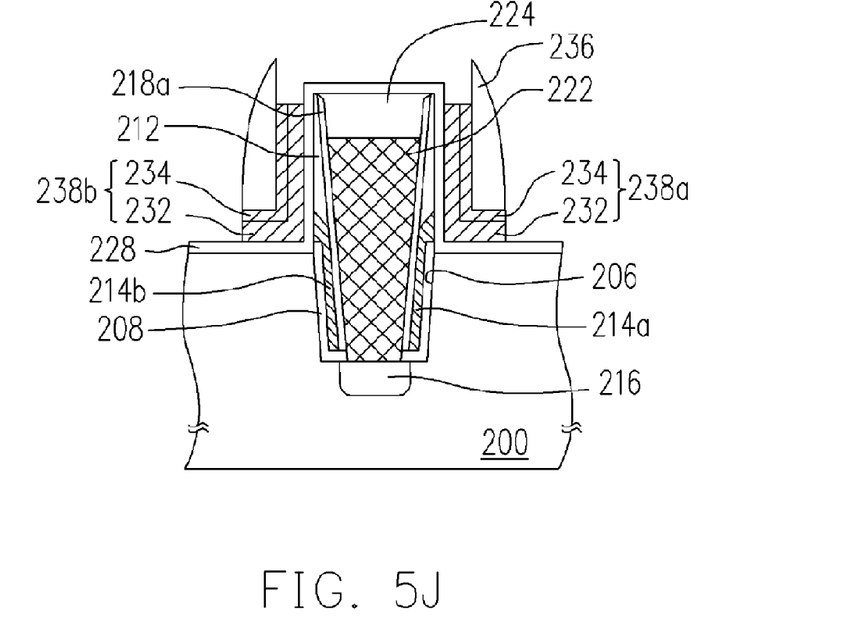

Referring to FIG. 5J, using the spacers 236 as a self-aligned mask, a portion of the conductive layer 230 (doped polysilicon layer 232 and silicide layer 234) is removed to form a pair of conductive spacers 238a and 238b on the sidewall of the spacer 212, the floating gates 214a and 214b, wherein the conductive spacers 238a and 238b can serve as a select gate or a word line. The related arrangements between the conductive spacers 238a, 238b, the source line 222 and the isolation structure 20 are shown in FIG. 4. The method of removing the conductive layer 230 includes but not limited to anisotropic etching.

It is worthy to note that before the conductive layer is formed, the height of the isolation structure is lowered. As a result, the isolation structure is prevented from being damaged during the formation of the conductive spacers 238a and 238b. The formation of re-entrant is thereby mitigated. Accordingly, two neighboring memory devices being connected, leading a short circuit between the devices due to a damaged isolation structure can be obviated. Additionally, in the above embodiment of the present invention, the height of the isolation structure 20 is used to define the heights of the floating gates 214a, 214b that are subsequently formed in the trench. Therefore, the height of the isolation structure 20 needs to be higher than a typical isolation structure. Further, the isolation structure 20 must maintain a certain height before the fabrication of the floating gates 214a and 214b. Accordingly, the method of the present invention can be used to lower the height of the isolations structure before the formation of the conductive layer and after the formation of the floating gates 214a and 214b.

The present invention provides at least the following advantages.

1. With the removal of the material layer and the subsequent removal of portions of the material layer and the isolation structure, the height of the isolation structure is lowered. Any damage to the isolation structure in the subsequent process, for example, during the wafer cleaning process, can be mitigated. Accordingly, the method of the present invention can effectively reduce the formation of a re-entrant in the isolation structure to prevent two neighboring semiconductor devices from being connected and a short circuit from occurring between devices.

2. Since the damages to the isolation structure are closely related to the type of process, the above-mentioned method for treating the isolation structure can apply to other types of device process in addition to the above device process.

3. The method for preventing damages to the isolation structure of the present invention can be applied at any point during the course of the process. In other words, if the isolation structure may be damaged during a subsequent process step, leading to an adverse yield, the method of the present invention can be applied, for example, before the formation of a particular structure, the wafer washing process or the formation of the conductive layer.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a semiconductor device, the method comprising:
   forming a plurality of isolation structures on a substrate to define an active region, wherein a top part of the isolation structures is higher than a surface of the substrate;
   forming a plurality of device structures in the active region of the substrate, wherein a height of the device structures is determined by the isolation structures;
   forming a material layer on the substrate to cover at least the isolation structures and an exposed portion of the substrate, wherein the material layer disposed the exposed portion of the substrate is thicker than that disposed on the isolation structures;
   removing the material layer disposed on the isolation structures and further removing a portion of the isolation structures, wherein a portion of the material layer disposed on the exposed portion of the substrate is also removed; and
   forming a conductive layer on the device structures.

2. The method of claim 1, wherein each device structure comprises at least a floating gate arid a top part of the floating gate is about the same height as the top part of the isolation structures before the portion of the isolation structures is removed.

3. The method of claim 1, wherein the material layer formed between the isolation structures is thicker than the material layer formed at the top part of the isolation structures.

4. The method of claim 1, wherein the material layer is constituted with a fluid-like material.

5. The method of claim 4, wherein the material comprises a photoresist material.

6. The method of claim 4, wherein the material comprises an organic anti-reflection coating material.

7. The method of claim 1, wherein the height of the isolation structure is lower to about 600 angstroms.

8. The method of claim 1, wherein the step of removing the portion of the material layer and the portion of the isolation structure comprises performing an etching back process.

9. The method of claim 8, wherein a thickness of the portion of the material layer and the portion of the isolation structures being removed is controlled by a duration of the etching back process.

10. The method of claim 1, wherein after the step of removing the portion of the material layer and the portion of the isolation structure and before the step of forming the conductive layer on the device structures further comprises removing a remaining of the material layer.

11. A method for fabricating a semiconductor device, the method comprising:
    forming a plurality of isolation structures on the substrate to define an active region, wherein a top part of the isolation structures is higher than a surface of the substrate;
    forming a plurality of trench type device structures in the active region of the substrate, wherein a top surface of the trench type device structures is higher than the surface of the substrate;
    forming a material layer on the substrate to cover the isolation structures, the trench type device structures and an exposed portion of the substrate, wherein the material layer comprises a fluid-like material such that the material layer disposed between the isolation structures is thicker than the material layer disposed at a top part of the device isolation structures and a top part of the trench type device structures;
    removing the material layer at the top part of the isolation structures and at the top part of the trench type device structures, and a portion of the isolation structures to lower a height of the isolation structures;
    removing a remaining of the material layer;
    forming an insulation layer on a surface of the trench type device structures; and
    forming a pair of conductive spacers on the insulation layer at a sidewall of the trench type device structures.

12. The method of claim 11, wherein the material layer comprises a photoresist material.

13. The method of claim 11, wherein the material layer comprises an organic anti-reflection coating material.

14. The method of claim 11, wherein the height of the isolation structures is lower to about 600 angstroms.

15. The method of claim 11, wherein the step of removing the portion of the material layer and the portion of the isolation structures comprises performing an etching back process.

16. The method of claim 15, wherein a thickness of the material layer and a thickness of the isolation structures removed are controlled by a duration of the etching back process.

17. The method of claim 11 wherein a method in forming the trench type device structures comprises:
    forming a plurality of trenches in the active region of the substrate;
    forming a tunneling layer on a surface of the substrate in each trench;
    filling each trench with a first conductive material;
    performing an etching back process for a top part of the first conductive layer to be at the same height as the top part of the isolation structures;
    removing a portion, of the first conductive material wherein a remaining of the first conductive material is disposed on a sidewall of each trench; and
    filling each trench with a second conductive material and forming a first gate dielectric layer for isolation between the second conductive material and the first conductive material.

18. A fabrication method for a memory device, comprising:
    forming a plurality of isolation structures on a substrate to define an active region;
    forming a patterned mask layer in the active region of the substrate;
    forming a plurality of trenches in the mask layer and in the substrate using the patterned mask layer as an etching mask;
    forming a tunneling layer on a surface of the substrate in each trench;
    filling a first conductive material in each trench;
    performing an etching back process for a top part of the first conductive material to be higher that the surface of the substrate but lower than a surface o:F the mask layer;
    forming a pair of spacers on a sidewall of an exposed portion of the trench, covering a portion of the conductive layer;
    removing a portion of the first conductive material to form a first floating gate and a second floating gate on a sidewall of each trench, using the pair of spacers as an etching mask;
    forming a source region in the substrate at a bottom of each trench;

forming a first gate dielectric layer on a surface of each trench;

removing a portion of the first gate dielectric layer and the tunneling layer to expose the surface of the substrate at the bottom of each trench;

filling each trench with a second conductive material to serve as a source line, wherein a top part of the source line is higher than a top part of the first floating gate and a top part of the second floating gate;

removing the patterned mask layer;

forming a material layer on the substrate to cover the isolation structure, die source line and an exposed portion of the substrate, wherein the material layer comprises a fluid-like material and the material layer formed between the isolation structures has a greater thickness than the material layer at a top part of the isolations structures and at a top part of the source line;

removing the material layer at the top part of die isolation structures and at the top part of the source line and removing a portion of the isolation structures to lower a height of the isolation structures;

removing a remaining of the material layer;

forming a second gate dielectric layer on the substrate to cover the source line; and forming a pair of conductive spacers on two sides of the source line.

19. The method of claim 18, wherein the material layer is a photoresist material or an organic anti-reflection coating material.

* * * * *